United States Patent
McDonald et al.

(10) Patent No.: US 6,188,345 B1
(45) Date of Patent: *Feb. 13, 2001

(54) HIGH SPEED DELTA-SIGMA A/D CONVERTER USING A QUANTIZED USM NEGATIVE FEEDBACK LOOP

(75) Inventors: Charles L. McDonald, No. Andover, MA (US); T. R. Viswanathan, Addison, TX (US); Krishnaswamy Nagaraj, Somerville, NJ (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 11 days.

(21) Appl. No.: 09/050,444

(22) Filed: Mar. 30, 1998

(51) Int. Cl.[7] .............................. H03M 3/00; H03M 1/12
(52) U.S. Cl. ............................................. 341/143; 341/155
(58) Field of Search ..................... 341/143, 155, 341/156, 158, 110, 144; 600/447; 375/240

(56) References Cited

U.S. PATENT DOCUMENTS

| | | | |
|---|---|---|---|
| 4,072,938 | * 2/1978 | Buchanan | 341/172 |
| 4,926,180 | * 5/1990 | Anastassiou | 341/159 |
| 5,369,403 | * 11/1994 | Temes et al. | 341/143 |

OTHER PUBLICATIONS

Harris et al, "Improved Performance of Multi–Bit Delta–Sigma Analog to Digital Converters Via Requantization," IEEE, 1629–1632, 1991.*

Harris et al, "On the Performance of an Oversampled Analog to Digital Converter with Digital Requantizer in Feedback Path," IEEE, 17–22, 1991.*

* cited by examiner

Primary Examiner—Patrick Wamsley
(74) Attorney, Agent, or Firm—Wade James Brady, III; Frederick J. Telecky, Jr.

(57) ABSTRACT

A high speed sigma-delta A/D converter for a sequence of analog samples $x_n$ (n=0,1,2, . . . N-1) has an input, a plurality N-1 of phase clocks $\Phi_n$, a plurality of sample-hold circuits $40_n$, a plurality N-1 of circuit stages, and a D/A converter. The input receives the analog samples $x_n$. The sample-hold circuits $40_n$ are coupled to the input and each responds to a respective phase clock $\Phi_n$ to sample and hold a corresponding analog sample $X_n$. Each circuit stage n has a summer $42_n$ and a quantizer $44_n$. The summer has (i) a data input receiving a data signal ($x_n$) from a corresponding sample-hold circuit $40_n$, (ii) a prior sum signal ($w_{n-1}$) input, and (iii) a prior quantized signal ($y_{n-1}$) negative input. The summer $42_n$ produces a sum signal ($w_n = x_n + w_{n-1} - Y_{n-1}$) at a summer output. The quantizer $44_n$ is coupled to the summer's output for quantizing the sum signal $w_n$ into a quantized sum signal $y_n$. The D/A converter provides the N-1 (last) stage's quantized sum signal $y_{N-1}$ to the prior sum signal input of the 0 (first) stage's summer $42_1$.

7 Claims, 6 Drawing Sheets

HIGH SPEED DELTA-SIGMA A/D CONVERTER USING A QUANTIZED USM NEGATIVE FEEDBACK LOOP

FIELD OF INVENTION

Our invention relates to A/D converters and more particularly to high speed delta-sigma A/D converters.

BACKGROUND

FIG. 1 shows a conventional first-order "1-bit" delta-sigma modulator (DSM) for analog-to-digital (A/D) converting a series of sample inputs $X_i$ into a 1-bit quantized signal $y_i$. It consists of an integrator 10 followed by a two-level (1-bit) comparator 12 with a negative feedback loop back to the input. The comparator 12 is clocked at some rate $f_s$ and generates a stream of decisions $y_i$ at the integrator output. The stream of decisions $y_i$ is fed back to the input to be subtracted from the stream of input samples $x_i$. Typically $f_s$ is several times higher than the Nyquist rate so that the 1-bit digital output $y_i$ is oversampled. The oversampled digital output can then be passed to a decimation filter (not shown) which averages the values to produce an n-bit result at a lower frequency.

The standard analysis of the operation of a DSM A/D converter uses a linear system approximation. The quantization error is assumed to be additive white gaussian noise, and it can be shown that this noise is shaped by a high-pass characteristic. This approximate explanation avoids the difficulties involved in a non-linear analysis, but it is limited in practice. It fails to predict important phenomena and suggests some erroneous behavior, mostly because the quantization error is actually deterministic and strongly correlated with respect to the input.

One can think of the integrator output as consisting of two sums: the sum of the input samples $x_i$, and the negative of the sum of the comparator decisions $y_i$ (either $V_r$ or $-V_r$). The negative feedback loop operates to keep the integrator output bounded, in which case $$\sum_i^N |x_i - y_i| < \sim V_r \quad \text{(Eq. 1)}$$

where $y_i \in \{V_r, -V_r\}$ and N is a certain number of decisions. This implies that $$\bar{x} = \bar{y} + V_r/N \quad \text{(Eq. 2)}$$

where $\bar{x}$ is an average over N values of $x_i$. Thus the modulator seeks to make the average of the output decision stream equal to the average of the sequence of input values.

FIG. 2 illustrates this behavior. It shows a highly oversampled input sinusoid together with the corresponding DSM output values from both first and second order structures. (The output levels are arbitrary.) Observe that in the vicinity of the positive input peak, the first-order system output values assume a limit cycle of frequency $f_s/4$. In general, there is a limit cycle corresponding to each DC input level, and some of these limit cycle frequencies fall in the signal baseband.

Higher order DSM architectures use more integrators to effectively break up lower frequency limit cycles into higher frequencies, as illustrated by the second order outputs in FIG. 3. Higher order architectures generate the same decision rate with similar properties with respect to the signal, but with limit cycles shifted to higher frequencies. This is a more general fact describing the non-linear behavior of DSM than the usual noise-shaping argument from the linear approximation to DSM.

Note that a simple average over N output decisions can give a resolution only to $2V_r/N$, so even with N=256, only 7-bit resolution would be achieved. Thus, the filter coefficients must be weighted.

Another typical way of looking at the operation of a DSM is to write the difference equations describing the discrete-time system shown in FIG. 3.

It can be shown [1] that the system of FIG. 3 satisfies the equation $$y_i = x_{i-1} + (e_i - e_{i-1}) \quad \text{(Eq. 3)}$$

where $e_i$ is defined to be the quantization error $e_i \equiv y_i - w_i$ and $y_i \in \{V_r, -V_r\}$. Note that for simplicity in FIG. 3 we have not explicitly shown a digital-to-analog (D/A) converter in the feedback path. It should be understood that the digital output can be any arbitrary pair of binary symbols, and that the feedback must be some appropriate pair of reference analog circuit reference quantities, here denoted $\{V_r, -V_r\}$.

According to equation 3, the term added to each input sample is the first difference of the quantization error, which suppresses the low-frequency components of the error. This effect is the familiar noise-shaping property of the DSM.

A frequency-response picture of the operation of first and second-order DSMs is shown in FIG. 4. The frequency response of a typical "$\text{sinc}^3$" filter is superimposed over the Discrete Fourier Transforms (DFT) of the 1-bit output streams of the modulators. The abscissa of the plot is linear normalized digital frequency where unity corresponds to the sample frequency. Note that this particular plot only covers the frequency interval [0, 0.03]. The sinc filter has zeros at multiples of $\frac{1}{64}$. The simulation input was a sinusoidal tone at a normalized frequency of 67/16384.

The DFTs in FIG. 4 clearly show the noise-shaping behavior of the modulators, i.e. the noise floor dramatically rolls off as the frequency approaches DC. This plot graphically illustrates how high signal to noise ratio (SNR) can be obtained from DSM by high oversampling and filtering with a lowpass filter. Of course, the drawback to high oversampling is that the allowable signal bandwidth is reduced, relative to the sampling frequency, by the oversampling ratio (OSR).

In summary, the standard delta-sigma data conversion technique achieves high resolution with very simple analog circuitry which can be made very robust with respect to component variation.

It is very desirable to explore methods of using the delta-sigma algorithm in data conversion architectures that trade increased circuit complexity for reduced oversampling ratio. In particular, the hardware requirements of flash converters grow faster than exponentially because the number of comparators grows exponentially with bits of resolution, and for improved matching the size of the comparator input devices tends to grow as the square root, with increasing resolution. Therefore, there is a need for fast data conversion architectures that grow less rapidly and possess more robust properties with respect to component variation.

The standard DSM technique uses temporal oversampling, where the oversampling factor is obtained by sequentially obtaining input samples with a single sampling block. As an alternative, it is possible to achieve oversampling spatially by using parallel sampling blocks. As previously mentioned, there is strong motivation to trade off temporal oversampling for spatial oversampling.

There are several existing approaches to parallelism with delta-sigma modulation data conversion. One approach is to use time-interleaved standard DSMs [2]. The signal is sampled by N identical parallel DSMs which are clocked at the same frequency but on distinct phases of an N-phase clock.

Another approach, shown in FIG. 5, uses Hadamard modulation to separate the input into N parallel, orthogonal data streams, which are then fed to N parallel DSM units $20_1, 20_2, 20_3, \ldots, 20_N$ [3]. The outputs are demodulated and filtered.

But these prior art architectures have inherent design limitations that our invention improves upon.

SUMMARY OF THE INVENTION

Rather than using parallel standard modulators, our approach seeks to create fast DSM architectures by "unraveling" the standard delta-sigma decision algorithm into a spatial structure, much as a "pipelined" A/D converter is obtained by unraveling a successive-approximation loop.

More particularly, our high speed sigma-delta A/D converter for a sequence of analog samples $x_n$ (n=0, 1, 2, ... N-1) has an input, a plurality N-1 of phase clocks $CLK_n$, a plurality of sample-hold circuits, a plurality N-1 of circuit stages, and a D/A converter. The input receives the analog samples $x_n$. The sample-hold circuits $SH_n$ are coupled to the input and each responds to a respective phase clock $CLK_n$ to sample and hold a corresponding analog sample $X_n$. Each circuit stage n has a summer and a quantizer. The summer has (i) a data input receiving a data signal $(x_n)$ from a corresponding sample-hold circuit $SH_n$, (ii) a prior sum signal $(w_{n-1})$ input, and (iii) a prior quantized signal $(y_{n-1})$ negative input. The summer produces a sum signal $(w_n = x_n + w_{n-1} - y_{n-1})$ at a summer output. The quantizer is coupled to the summer's output for quantizing the sum signal $w_n$ into a quantized sum signal $y_n$. The D/A converter provides the N-1 (last) stage's quantized sum signal $Y_{n-1}$ to the prior sum signal input of the 0 (first) stage's summer.

DETAILED DESCRIPTION

Figure 6:
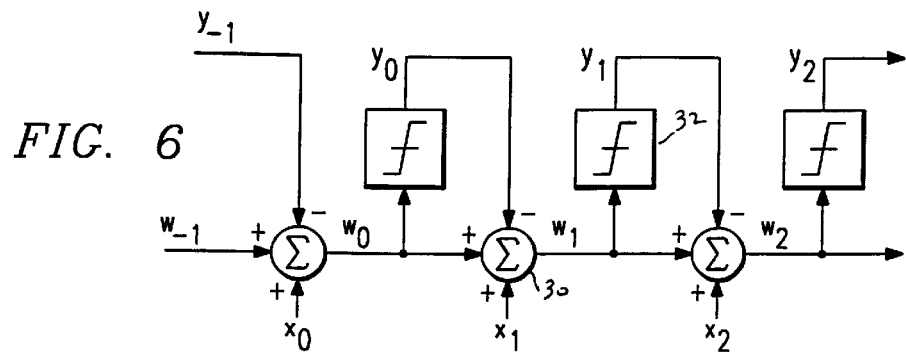
FIG. 6 is a diagram of an expanded multi-stage first-order DSM.

As shown in FIG. 6, an expanded delta sigma structure can be obtained by instantiating a new stage of hardware for each sample index i of the delta-sigma difference equation. Thus, the expanded structure of FIG. 6 also satisfies Equation 3 for a finite number of samples corresponding to the number of stages in the structure.

Figure 1:
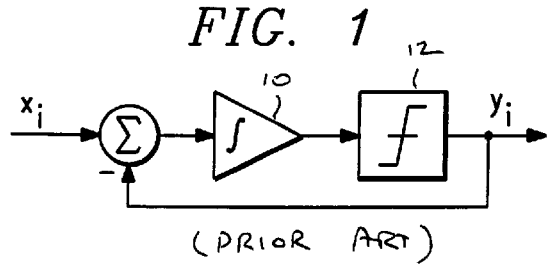
FIG. 1 is a diagram of prior art first order "1-bit" delta-sigma modulator (DSM) for analog to digital conversion.
Figure 2:
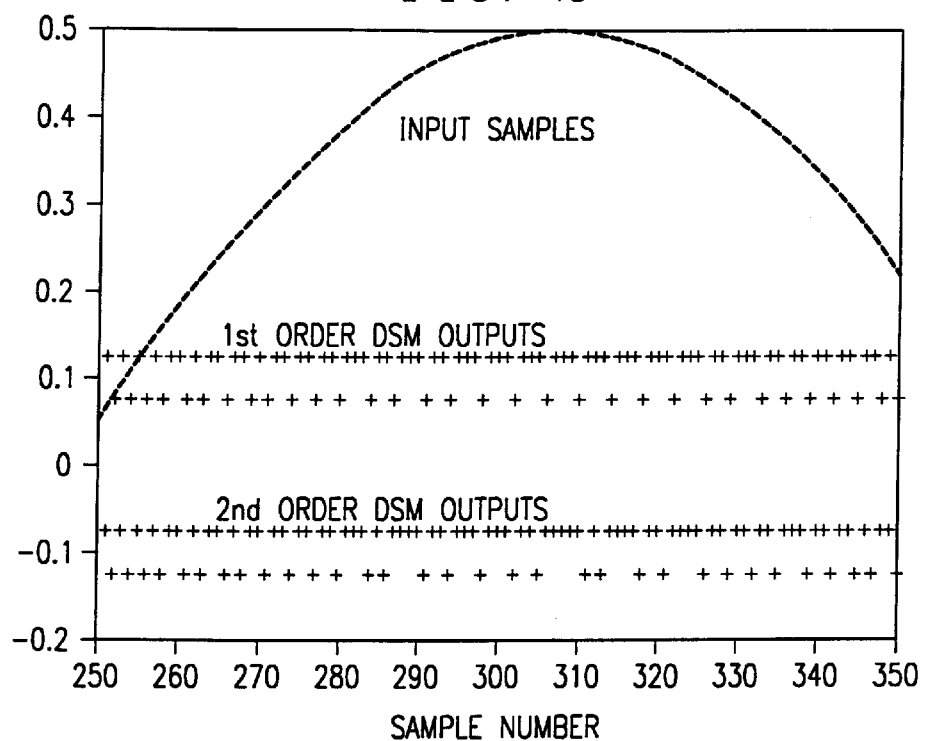
FIG. 2 is a graph of an input sinusoid and the corresponding first and second-order outputs from a DSM having first and second order structures.
Figure 3:
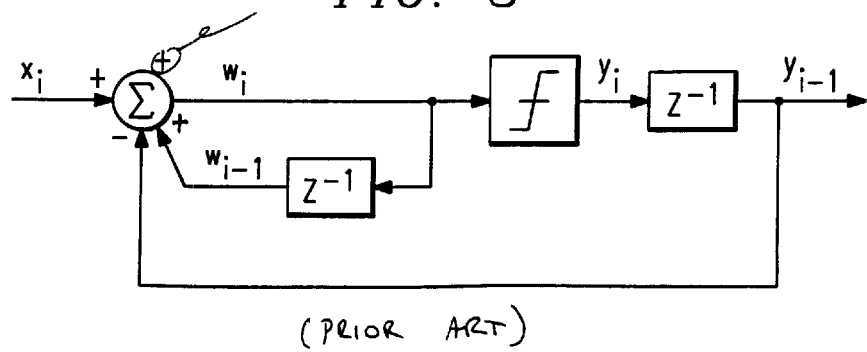
FIG. 3 is a diagram of a discrete-time first-order DSM for analog to digital conversion.
Figure 4:
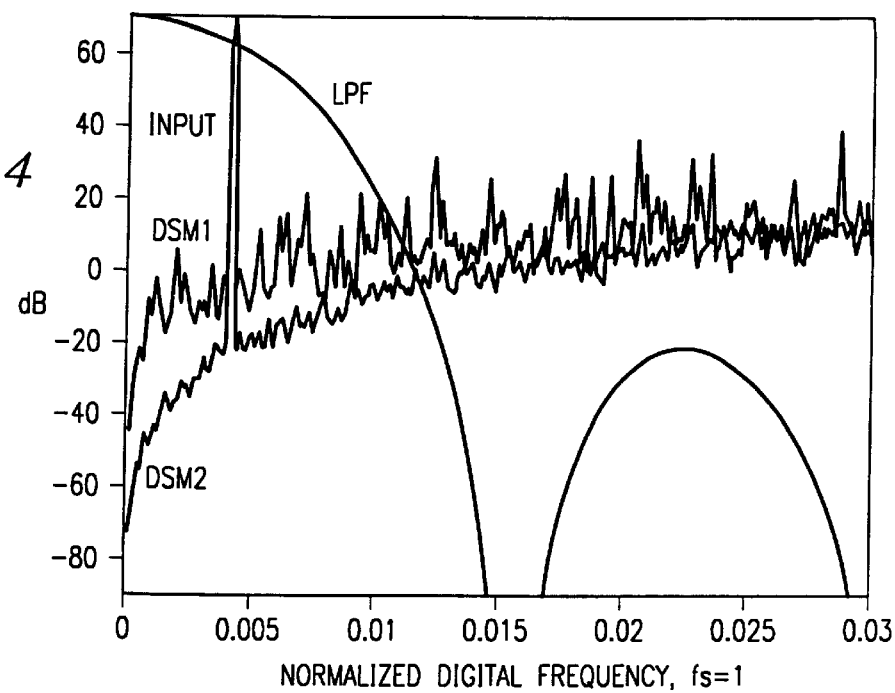
FIG. 4 is a graph of discrete fourier transforms of the onebit output streams of first and second-order outputs from a DSM having first and second order structures for a sinusoidal input tone at a normalized frequency of 67/16384 (~0.004) cycles/sec for the frequency range 0–0.03 cycles/sec, with the frequency response of a typical sinc3 filter superimposed.
Figure 5:
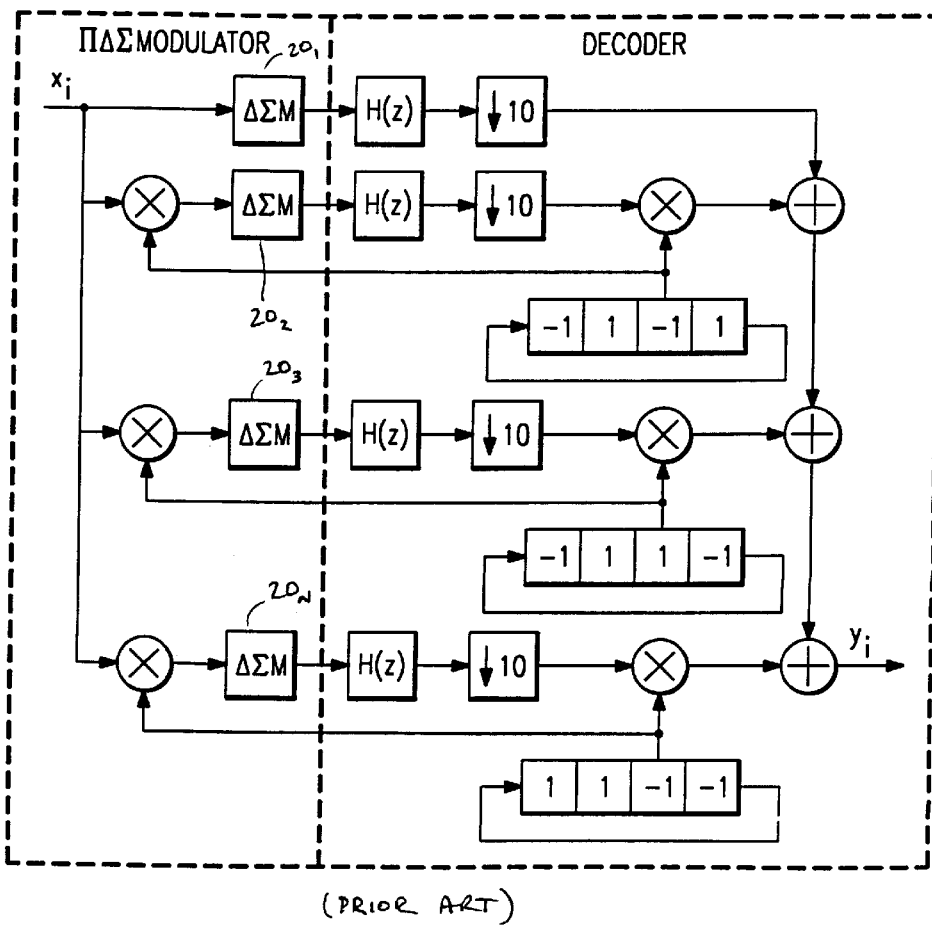
FIG. 5 is a diagram of a prior art parallel DSM converter according to Jensen and Galton that uses Hadamard modulation to separate the input into N parallel orthogonal data streams fed to N parallel DSM units.

For example, suppose that the standard modulator of FIG. 3 starts up with input samples $\{x_0, x_1, x_2, x_3, \ldots\}$. It must have some arbitrary initial conditions $w_{-1}$ and y_for its integrator state and comparator output. Let the initial conditions $w_{-1}$ and $y_{-1}$ of FIG. 6 be set similarly. The structure accepts the first input sample $x_0$ and sums with $w_{-1}$ and $y_{-1}$ to form a new accumulator output value $w_0$. The structure then compares the accumulator output $w_0$ to some threshold (implicitly zero), and latches this decision as digital output $y_0$.

In the standard modulator, the decision $y_0$ is fed back to the summer and the computation is repeated with the same hardware using the next input value $x_1$. In the expanded structure, however, the next computation is performed with a new summer 30 and comparator 32 which comprise the next decision stage. The sequence of computations is identical in both structures, except that the structure shown in FIG. 6 is finite in length.

The sequence of values $w_i$ in FIG. 3 is the integrator output. The same sequence of values appear in the expanded structure of FIG. 6. In such a structure, we will refer to the most recently computed $w_i$ as the "effective integrator output".

The sequence of input samples may be generated by several means, such as a tapped delay line or a bank of sample-hold blocks. In the standard DSM, a single sample-hold block obtains the samples at a repetition rate $f_s$. To obtain an arbitrarily higher rate of samples with the same clock frequency (or the same rate of samples with slower clocks) a bank of N sample-hold devices may be used, together with a set of N+1 phase clocks, as illustrated in the timing chart of FIG. 7.

Figure 7:
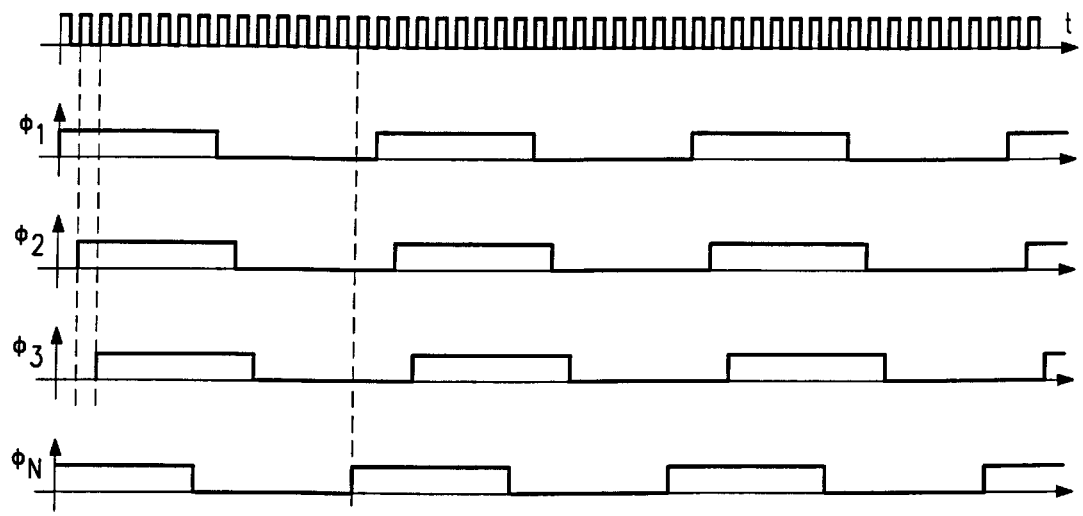
FIG. 7 is a timing diagram showing how a bank of N sample-hold devices can be used with a set of N phase clocks to obtain a higher rate of samples for a given clock frequency.
Figure 8:
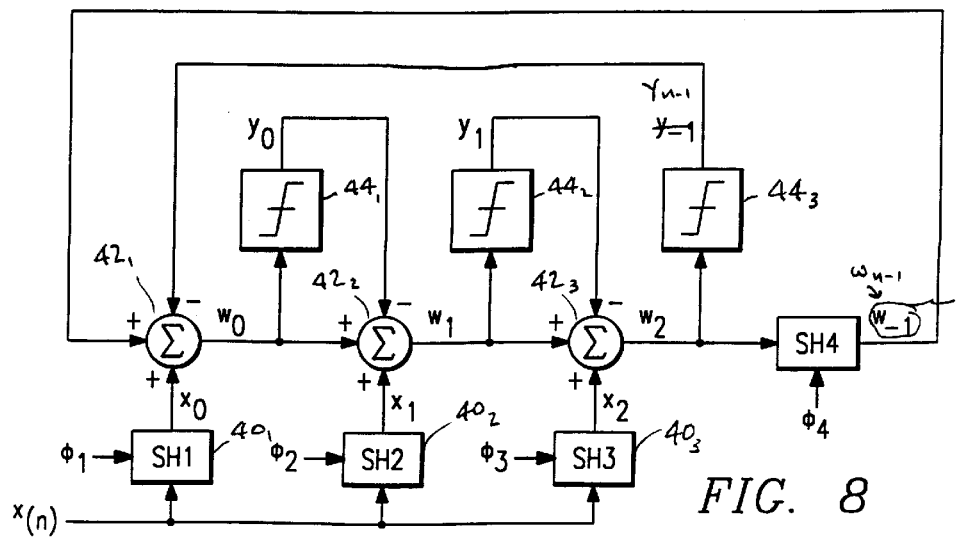
FIG. 8 is a diagram of an expanded three-stage DSM structure algorithmically equivalent to the standard DSM of FIG. 3.

As shown in FIG. 8, the expanded modulator of FIG. 6 can be made algorithmically identical to the modulator of FIG. 3 by feeding the outputs of the rightmost comparator and integrator of FIG. 6 back to its inputs at the left and providing N+1 sample-hold blocks clocked by the phase clocks of FIG. 7. Although FIG. 8 shows only three hardware stages, with suitable adjustments fewer or more stages can be accommodated.

In this expanded structure, only one stage is actively computing at a given time, and the effective integrator output proceeds around the structure in a wave. The comparators at each stage are clocked after the summer output at that stage is settled. For stability, at least one sample-hold function (SH4) must be included in the feedback loop that corresponds to the effective integrator output.

This expanded structure might be adapted to behave similarly as a ring oscillator. If the summer elements operate in continuous time the summer structure could be allowed to run free, and a phase-locked loop locked to the summer outputs could generate appropriate clocks for the comparators and input sample-holds.

Figure 9:
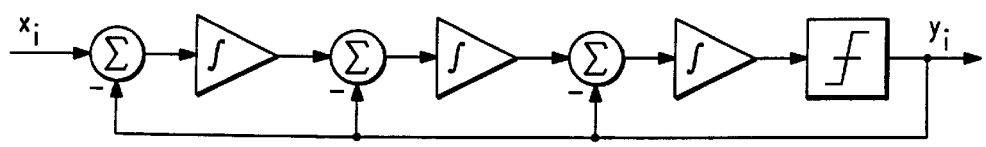
FIG. 9 is a diagram of a prior art third-order DSM structure.
Figure 10:
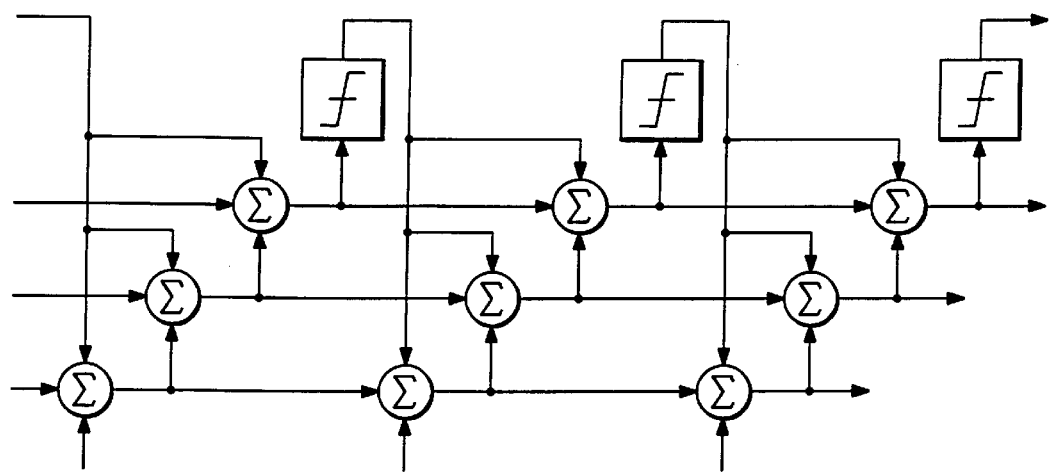
FIG. 10 is a diagram of an expanded DSM structure algorithmically equivalent to the third-order DSM of FIG. 9.

The expansion method may be applied to many other standard DSM architectures. For example, FIG. 9 shows a third-order DSM that can be expanded in three hardware stages as shown in FIG. 10, each stage of the expanded structure requiring three 3-input summers and a comparator.

Our expanded structure has several advantages. To compare our expanded DSM with a standard structure, suppose that identical resolution requirements are imposed and that similar technologies are applied to each functional block.

The expanded structure avoids the need for a delay element in the integration path, which instead is obtained by sequential summation. A direct speed advantage is obtained if when sequential summation interleaved with comparison and feedback is faster than summation interleaved with sample-hold and feedback. For example, when a comparison cycle is faster than a sample-hold cycle, or if the removal of the sample-hold cycle makes the summation faster (by removing loading) then the expanded structure is faster than the standard structure.

The standard modulator structures typically incorporate discrete-time integrators (accumulators) which must be implemented with a delay element. Any such delay elements must include an energy storage element (in present VLSI technology always a capacitor) and clocked switches to couple this element to different parts of the circuit.

Generally, the sampled data clocking schemes for the delay element require a two-phase non-overlapping clock. By eliminating the delay element, the expanded structure eliminates one of the clock transition periods from the decision cycle. A clock phase is still required for the comparator latch in each stage. But by using "lookahead" techniques, it is possible to defer the digital decisions until the end of several summation stages, at which point all the decisions are made on one clock edge.

Furthermore, it is likely that the switched delay element will always impose more capacitive load on a summer output than a similar summer input. The size of the storage capacitors and switches is lower-bounded by charge-injection and clock-feedthrough considerations. (In typical switched capacitor DSM A/D converters, the lower bound is due to thermal noise, but for less than 7-bit resolution, thermal noise is insignificant.) The switches which reconfigure the discrete-time circuit will always impose charge-injection and clock-feedthrough on the energy storage elements. Although the use of differential circuit techniques can mostly cancel the differential mode component, the common-mode component still exists. In order to limit the common-mode swing due to charge injection, the storage capacitor will have to be about an order of magnitude larger than the switch channel capacitance, which is of the same order as the input capacitance of a summer stage. Therefore, the delay element always imposes a loading penalty on the delta-sigma cycle time, and the expanded structure should have considerably faster cycle time.

Figure 11:
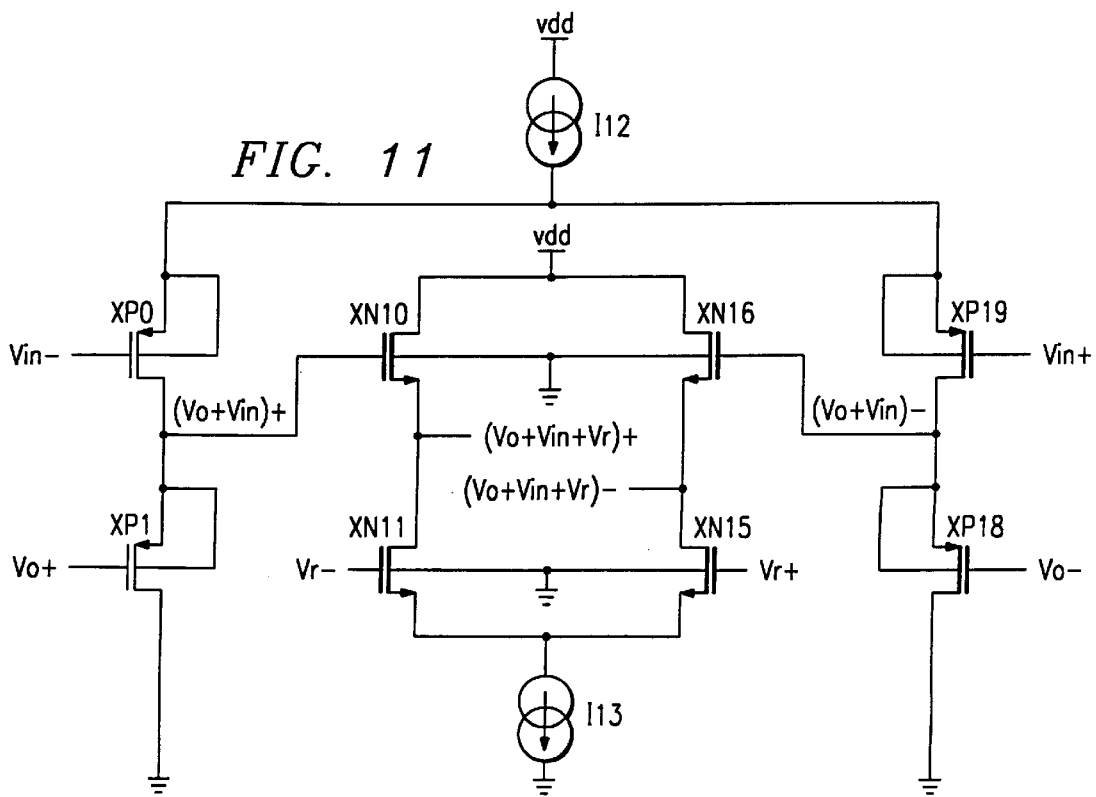
FIG. 11 is a schematic of a fast summer for high-speed expanded DSM A/D converters.

Our expanded delta-sigma structure can best be exploited by using a fast continuous-time summer. Since the expanded concept is well-suited for high-speed, low-resolution applications, very high linearity is not required, and thus it may be possible to avoid using feedback. The gain of the stage with respect to each input only needs to be about unity. Therefore, a summer can be implemented with relatively simple electronics such as shown in FIG. 11, which is shown as an example of the types of circuits being considered.

The summer uses a fully differential structure primarily to facilitate signal inversion and to improve linearity by canceling the even part of the transfer function nonlinearity. The signal $V_{in}$ denotes an input from the bank of input sample-holds. $V_O$ denotes an input from a previous summer stage. $V_r$ denotes the binary reference voltage feedback. With respect to $V_{in}$, p-transistors XP0 and XP19 are common-source amplifiers with P-channel loads XP1 and XP18. If channel-length modulation is ignored, the transfer function from gate to drain of the common-source transistors is large-signal linear with gain determined by ratio of device sizes. Normally not a practical gain technique, it is ideal here since the gain is near unity. Also, the Miller effect multiplication of $C_{gd}$ becomes only a factor of two.

With respect to $V_o$, XP1 and XP18 are source followers, so the sum of $V_{in}$ and $V_o$ appears at the drain of XP0 with respect to the drain of XP19.

Since the common-mode voltage of the output needs to be the same as that of $V_o$, a similar stage, but with N-channel transistors to obtain a level shift, might be used to add in $V_r$. This concept has the possible disadvantage that the body effect of the n-channel devices in the second stage may deteriorate the linearity to an unacceptable degree. Various concepts of similar simplicity are being considered.

The key feature of such circuits is the speed with which the summation may be accomplished. The capacitive loads are minimal. The absence of a delay element in the expanded delta-sigma concept means that the only load on the summer is the succeeding summer and the comparator. Since the comparators do not need to have low offset, the load they impose on the summer is small.

Figure 12A:
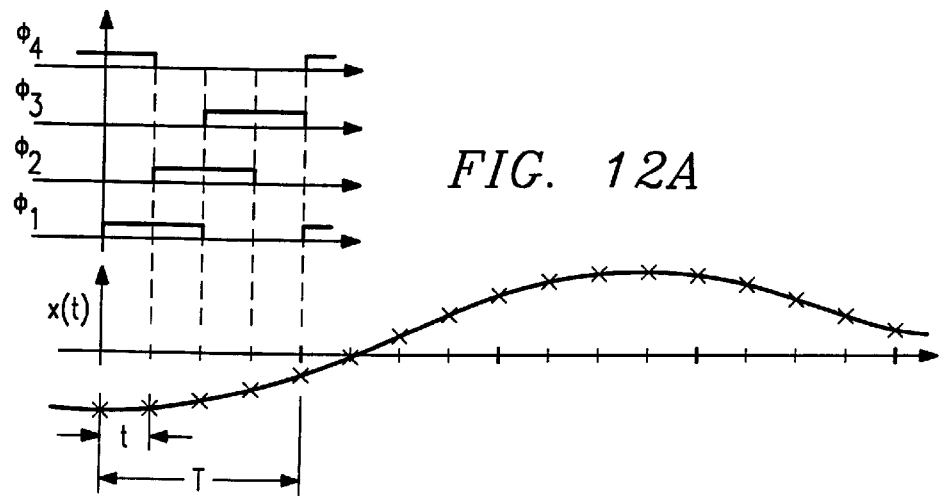
FIG. 12 is a schematic of a pipelined high-speed expanded DSM in which there are four decision stages fed by a bank of four sample-hold blocks, together with its timing diagram.
Figure 12B:
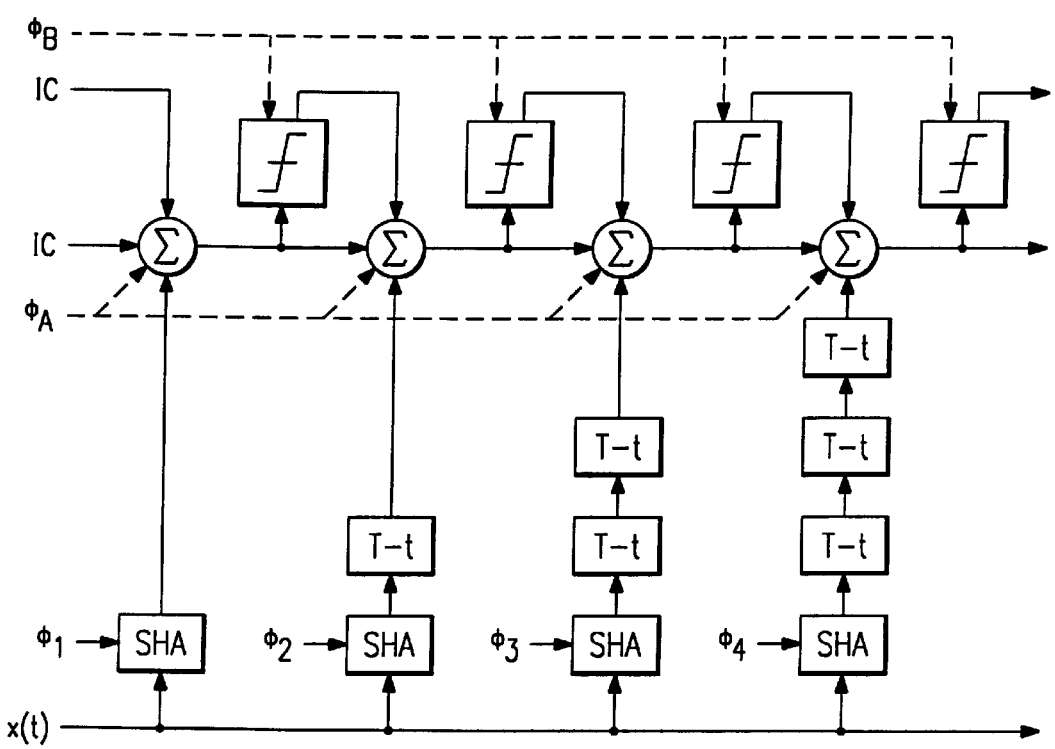
Figure 13:
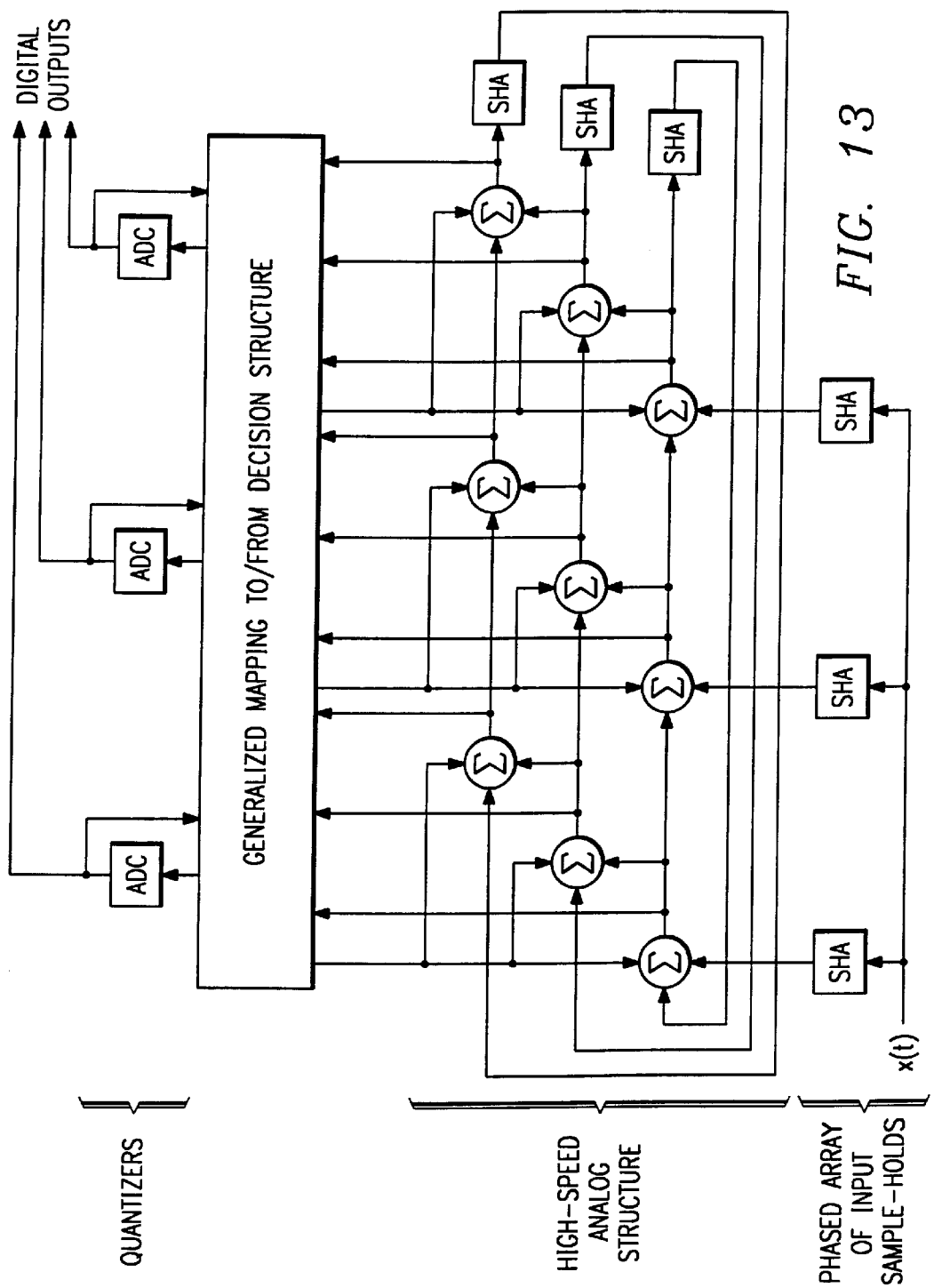
FIG. 13 is a schematic of a pipelined high-speed DSM.

A pipelined DSM concept using the expanded structure is shown in FIG. 12. Suppose we wish to sample the input and obtain delta-sigma decisions at intervals of t. But suppose this interval is much smaller than the interval T required to perform a summation and comparison. A solution is to operate the cyclic bank of N sample-hold blocks on a set of multiple phase clocks of frequency 1/T, (as in FIG. 7) which yields the required sample rate of N/T=1/t, with N streams of interleaved samples available at the sample-hold outputs each at rate 1/T.

Now consider the operation of the decision structure (composed of the set of summers and comparators). Assume, for the moment, that initial conditions are obtained for the accumulator and quantizer feedback inputs of the first stage. The first stage operates on the first sample and its outputs become available to the second stage after an interval of T. However, the next sample of the input was available from the second sample-hold block after only an interval of t. Therefore a delay of (T-t) must be inserted at the output of the second sample-hold. The outputs of the second stage become available to the third at time 2T, while the third sample was available at time 2t, so a delay of 2T-2t must be inserted, and so forth.

Each computational stage accepts inputs at rate 1/T, therefore all stages are operating on inputs simultaneously. Thus the structure is truly a pipelined structure, as opposed to the concept of FIG. 8 in which only one stage is actively computing a new output. The pipelined operation implies that the summer blocks must incorporate sampling functions, so that the previously computed output of each summer is stored for access by the next stage, while the new sum is being computed.

The number of delay elements required grows as $N^2$ where N is the number of stages in the decision structure. Therefore, it is desirable to minimize the required number of stages.

The linearly-increasing length delay lines need not be a sequential chain of delay elements as shown in FIG. 12. If each delay element contributes an independent noise component of standard deviation $\sigma_{de}$ to the signal sample, then the standard deviation of noise added will be $\sigma_{de}\sqrt{N}$, which is undesirable. Instead, each delay line may consist of a bank of analog storage elements (capacitors), together with read and write amplifier, similarly to that used by Nishimura [5]. To avoid the generation of pattern noise, the storage elements may be accessed psuedo-randomly.

It is not necessary that the number of sample-hold elements be the same as the number of decision stages. It is only convenient that the rate of sample acquisition must be equal to the rate of sample processing.

A key problem with this pipelined structure involves the latency between the first stage decisions and the last stage decisions. If there are N stages in the structure, each of which presents outputs at intervals T, and t=T/N, then the computation using the Nth sample is performed (by the Nth stage) about (N−1)T after the computation on the N+1 sample is performed (in the next cycle) by the first stage. Therefore, the digital decision and effective accumulator values from the Nth stage cannot be fed back to the first stage. Thus, the first stage must be arbitrarily initialized.

The effect of initializing the first stage is exactly the same as periodically (frequently) initializing the integrator outputs in a standard modulator. At this time, we know of one filtering technique, applied to standard DSM modulation, which surmounts the problem of frequent integrator reset. However, this technique has been patented.[7] (Some of the essential aspects of this patent were discussed in open literature several years before the patent was granted.) We believe there are other ways to optimally filter the pipelined concept outputs without infringing on the patent.

In the example of FIG. 12, there are four decision stages fed by a bank of four sample-hold blocks. Using the filtering technique of [7], we have found that a fourth-order (four summers per stage) 16-stage structure can generate 6-bit resolution samples at the clock frequency of the stage (1/T).

The following references referred to in the text above are hereby incorporated by reference:

[1] J. Candy and G. Temes, "Oversampling Methods for A/D and D/A Conversion", pp. 1–25 in the same authors' *Oversampling Delta-Sigma Convertors: Theory, Design, and Simulation*, IEEE Press (Piscataway, N.J. 1992).

[2] R. Khoini-Poorfard and D. Johns, *Time-Interleaved Oversampling Convertors*, Electronics Letters, Sep. 17, 1993, vol.29, No.19, pp. 1673–4.

[3] Jensen HT, Galton I, "A robust parallel delta-sigma A/D converter architecture.",1995 IEEE Symposium on Circuits and Systems New York, N.Y., USA: IEEE, 1995, Vol. 2, pp. 1340–3

[4] Poularikas AD, (editor)The transforms and applications handbook. Boca Raton Fla.: CRC Press, c1996.

[5] Nishimura, Ken A., Optimum partitioning of analog and digital circuitry in mixed-signal circuits for signal processing Dissertation, UC Berkeley, 1993.

[6] Hein S, Ibraham K, Zakhor A "New properties of sigma-delta modulators with DC inputs", IEEE Transactions on Communications 40(8), pp 1375–87, August 1992.

[7] Lyden CSingle Shot Sigma-Delta Analog to Digital Converter, U.S. Pat. No. 5,189,419, Feb. 23, 1993.

What is claimed is:

1. A sigma-delta A/D converter, comprising:

a plurality of sample-hold circuits coupled to receive an analog input signal, each responsive to a respective one of a plurality of phase clocks to sample and hold a corresponding sample of the analog input signal;

a plurality of circuit stages arranged in a sequence, each circuit stage associated with one of the plurality of sample-hold circuits, a first one of the plurality of circuit stages comprising:

a summer having a first input receiving a data signal from a first one of the plurality of sample-hold circuits, a second input receiving an initial prior sum signal, and a negative input receiving an initial prior quantized sum signal, for producing a sum signal at a summer output; and a quantizer coupled to the summer output for quantizing the sum signal into a quantized sum signal;

and wherein each of the other of the plurality of circuit stages comprise:

a summer having a first input receiving a data signal from a corresponding sample-hold circuit, a second input receiving a prior sum signal from the summer output of the prior circuit stage in the sequence, and a negative input receiving a prior quantized sum signal from the quantizer of the prior circuit stage in the sequence, for producing a sum signal at a summer output; and a quantizer coupled to the summer output for quantizing the sum signal into a quantized sum signal.

2. The converter of claim 1, further comprising:

a plurality of delay stages of varying lengths, each coupled between one of the plurality of sample-hold circuits and the summer of its associated circuit stage, the plurality of delay stages having increasing delay lengths corresponding to the position of its associated circuit stage in the sequence, so that the data signal from each sample-hold circuit is applied to the summer in each circuit stage at a time corresponding to the generation of the prior sum and prior quatized sum signals by the prior circuit stage in the sequence.

3. The converter of claim 2 wherein each of the plurality of delay stages comprises a bank of analog storage elements coupled to a read and write amplifier.

4. The converter of claim 1, further comprising:

a feedback sample-hold circuit, having an input coupled to the summer output of a last one of the plurality of circuit stages in the sequence, and having an output coupled to the second input of the summer of the first one of the plurality of circuit stages, to provide the initial sum value;

and wherein the output of the quantizer of the last one of the plurality of circuit stages in the sequence is coupled to the negative input of the summer of the first one of the plurality of circuits stages, to provide the initial prior quantized sum signal.

5. The converter of claim 1, further comprising:

a phase-locked loop, coupled to the summer outputs of the plurality of circuit stages, for generating the plurality of phase clocks.

6. The converter of claim 1, wherein each of the summers is a continuous-time differential summer.

7. The converter of claim 1, wherein each of the plurality of circuit stages comprise a plurality of summers arranged in a sequence;

wherein a first one of the plurality of summers in the sequence has a data input coupled to the associated sample-hold circuit, a second input receiving a prior sum signal from a corresponding first summer in a prior circuit stage, and a negative input receiving the quantized prior sum signal;

wherein each of the other ones of the summers in the sequence have a data input coupled to the output of a previous summer in the sequence, a second input receiving a prior sum signal from a corresponding summer in a prior circuit stage, and a negative input receiving the quantized prior sum signal;

and wherein a last one of the summers in the sequence presents the sum signal to the quantizer of the associated circuit stage.

* * * * *

UNITED STATES PATENT AND TRADEMARK OFFICE
CERTIFICATE OF CORRECTION

PATENT NO.   : 6,188,345 B1
DATED        : February 13, 2001
INVENTOR(S)  : Charles L. McDonald, T.R. Viswanathan and Krishnaswamy Nagaraj It is certified that error appears in the above-identified patent and that said Letters Patent is hereby corrected as shown below:

<u>Title page,</u>
Item [63], insert:
-- Related U.S. Application Data Provisional application No. 60/042,887, Mar. 31, 1997 --.

<u>Column 1,</u>
Line 3, insert:
-- This application claims priority under 35 USC 119(e)(1) of provisional application number 60/042,887, filed 3/31/97. --

Signed and Sealed this

Twenty-fourth Day of September, 2002

Attest:

JAMES E. ROGAN
Attesting Officer       Director of the United States Patent and Trademark Office